(12) United States Patent
Son et al.

(10) Patent No.: US 12,249,491 B2
(45) Date of Patent: Mar. 11, 2025

(54) SUBSTRATE TREATING APPARATUS AND SUBSTRATE SUPPORT UNIT

(71) Applicant: SEMES CO., LTD., Chungcheongnam-do (KR)

(72) Inventors: Hyoungkyu Son, Seoul (KR); Jong-Hwan An, Yongin-si (KR); Jae Hyun Cho, Suwon-si (KR); Min Keun Bae, Cheonan-si (KR); Dong Suk Kim, Hwaseong-si (KR); Hyeon Gyu Kim, Cheonan-si (KR); Ogsen Galstyan, Cheonan-si (KR); Won Seok Lee, Seoul (KR); Sung Je Kim, Hwaseong-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 608 days.

(21) Appl. No.: 17/395,860

(22) Filed: Aug. 6, 2021

(65) Prior Publication Data

US 2022/0044917 A1  Feb. 10, 2022

(30) Foreign Application Priority Data

Aug. 7, 2020 (KR) .................. 10-2020-0099019
Dec. 8, 2020 (KR) .................. 10-2020-0170465

(51) Int. Cl.
*H01J 37/32* (2006.01)
*H01L 21/3065* (2006.01)

(52) U.S. Cl.
CPC .. *H01J 37/32715* (2013.01); *H01J 37/32568* (2013.01); *H01J 37/32577* (2013.01);
(Continued)

(58) Field of Classification Search
None
See application file for complete search history.

(56) References Cited

U.S. PATENT DOCUMENTS

| 2004/0027781 A1* | 2/2004 | Hanawa ............ H01J 37/32724 361/234 |
| 2010/0025372 A1* | 2/2010 | Tsujimoto ......... H01J 37/32091 156/345.28 |

(Continued)

FOREIGN PATENT DOCUMENTS

| JP | 2007-258608 A | 10/2007 |
| JP | 2007-266231 A | 10/2007 |

(Continued)

OTHER PUBLICATIONS

Korean Patent Office, Office action issued on Dec. 21, 2022.
Japan Patent Office, Office action issued on Dec. 13, 2022.

*Primary Examiner* — Ram N Kackar
*Assistant Examiner* — Laureen Chan
(74) *Attorney, Agent, or Firm* — Li & Cai Intellectual Property (USA) Office

(57) ABSTRACT

The inventive concept relates to a substrate support unit provided in an apparatus for treating a substrate using plasma. In an embodiment, the substrate support unit includes a dielectric plate on which the substrate is placed, a lower electrode that is disposed under the dielectric plate and that has a first diameter, a power supply rod that applies RF power to the lower electrode and has a second diameter, and a ground member disposed under the lower electrode and spaced apart from the lower electrode by a first gap by an insulating member, the ground member including a plate portion having a through-hole formed therein through which the power supply rod passes, in which the through-hole has a third diameter.

9 Claims, 11 Drawing Sheets

(52) U.S. Cl.
CPC . *H01J 37/32082* (2013.01); *H01J 2237/2007* (2013.01); *H01J 2237/3343* (2013.01); *H01L 21/3065* (2013.01)

(56) References Cited

U.S. PATENT DOCUMENTS

2015/0107772 A1\* 4/2015 Uchida ............. C23C 16/45565
  156/345.33
2023/0059495 A1\* 2/2023 Marakhtanov ...... H01L 21/6833

FOREIGN PATENT DOCUMENTS

| JP | 2009-231683 A | 10/2009 |
| JP | 2016-219790 A | 12/2016 |
| KR | 10-2007-0052112 A | 5/2007 |
| KR | 1020170140926 A | 12/2017 |
| KR | 1020200083330 A | 7/2020 |
| KR | 1020200086630 A | 7/2020 |

\* cited by examiner

SUBSTRATE TREATING APPARATUS AND SUBSTRATE SUPPORT UNIT

CROSS-REFERENCE TO RELATED APPLICATIONS

A claim for priority under 35 U.S.C. § 119 is made to Korean Patent Application Nos. 10-2020-0099019 and 10-2020-0170465 filed on Aug. 7, 2020 and Dec. 8, 2020, respectively, in the Korean Intellectual Property Office, the entire contents of which are hereby incorporated by reference.

BACKGROUND

Embodiments of the inventive concept described herein relate to an apparatus for treating a substrate using plasma and a substrate support unit that is provided in the apparatus and that supports the substrate.

Plasma is generated by heating a neutral gas to a very high temperature or subjecting the neutral gas to a strong electric field or a radio frequency (RF) electromagnetic field and refers to an ionized gaseous state of matter containing ions, electrons, and radicals. A semiconductor device manufacturing process may include an etching process, an ashing process, and the like that use plasma. A process of treating a substrate, such as a wafer, using plasma is performed by collision of ions and radicals contained in the plasma with the substrate.

In general, an apparatus for treating a substrate using plasma includes a lower electrode as a plasma source for exciting a process gas into plasma. For example, as illustrated in FIG. 1, an apparatus for treating a substrate using plasma includes a support member 10 that supports the substrate. The support member 10 includes an electrostatic chuck 1, a lower electrode 2, an insulating member 3 formed of a ceramic material, and a conductive member 4. The conductive member 4 is grounded. The lower electrode 2 is coupled with an RF rod 5. The lower electrode 2 is electrically connected with the RF rod 5. The RF rod 5 is connected with a power supply 6. The power supply 6 applies RF power to the RF rod 5. That is, the RF rod 5 applies the RF power to the lower electrode 2. In general, the substrate W is supported on the top side of the lower electrode 2. That is, the lower electrode 2 may allow plasma to be generated above the substrate W. RF current flows through the RF rod 5 connected to the power supply 6. The RF current flows along the surface of the RF rod 5. An air gap is formed between the lower electrode 2 and the conductive member 4.

The air gap structure illustrated in FIG. 1 may help to control arcing even when high power is fed to a lower portion, and as power loss is lower than that in the related art even when high power is input, an electrode structure having a low temperature and a relatively low power loss may be obtained. Furthermore, even in terms of the symmetry of plasma, many effects may be obtained by the constant gap between the conductive member 4 and the lower electrode 2 that form the air gap under the lower electrode 2.

The air gap structure may dramatically increase processing efficiency, compared to the structure of existing equipment. However, impedance may be increased by mutual electrical influences between the RF rod 5, the lower electrode 2, and the conductive member 4, and even though the voltage of power is raised, the field effect formed on the lower surface may inevitably affect a substrate treating process.

Furthermore, dispersion of a strong electric field may occur in the area where the RF rod 5 and the lower electrode 2 are in contact with each other, and due to the dispersion of the strong electric field, RF current delivered to the lower electrode 2 may be differently delivered to the area of the lower electrode 2 viewed from above. Therefore, an electric field may not be uniformly generated above the substrate, and the uniformity of plasma generated above the substrate may be lowered, which may lead to a decrease in substrate treating efficiency.

SUMMARY

Embodiments of the inventive concept provide a support unit for efficiently treating a substrate, and a substrate treating apparatus including the support unit.

Embodiments of the inventive concept provide a support unit for minimizing concentration of an electric field on an area where an electrode and a power supply rod provided in the support unit are connected and minimizing electrical impedance, and a substrate treating apparatus including the support unit.

Embodiments of the inventive concept provide a support unit for providing an additional control factor in adjusting the density of plasma generated above a substrate, and a substrate treating apparatus including the support unit.

Embodiments of the inventive concept provide a support unit for improving etch rate (ER) uniformity for each region of a substrate by cancelling out high field strength concentrated on a central portion of the substrate (e.g., a wafer), and a substrate treating apparatus including the support unit.

Embodiments of the inventive concept provide a support unit for minimizing an eddy current formed in an area of a ground member when feeding RF power, and a substrate treating apparatus including the support unit.

Embodiments of the inventive concept provide a support unit for minimizing noise caused by RF energy delivered to a ground member in a process of feeding RF power, and a substrate treating apparatus including the support unit.

The technical problems to be solved by the inventive concept are not limited to the aforementioned problems, and any other technical problems not mentioned herein will be clearly understood from the following description by those skilled in the art to which the inventive concept pertains.

According to an embodiment, a substrate support unit provided in an apparatus for treating a substrate using plasma includes a dielectric plate on which the substrate is placed, a lower electrode that is disposed under the dielectric plate and that has a first diameter, a power supply rod that applies RF power to the lower electrode and has a second diameter, and a ground member disposed under the lower electrode and spaced apart from the lower electrode by a first gap by an insulating member, the ground member including a plate portion having a through-hole formed therein through which the power supply rod passes, in which the through-hole has a third diameter. The lower electrode includes a deformation portion extending downward from a center of a lower surface of the lower electrode and having a decreasing diameter toward the bottom, and the power supply rod is coupled to an end portion of the deformation portion.

In an embodiment, the ground member may further include a guide portion extending upward from an inner diameter of the through-hole by a predetermined length and spaced apart from the power supply rod by a second gap.

In an embodiment, the guide portion may include an extension extending along the deformation portion and spaced apart from the deformation portion by a predetermined distance.

In an embodiment, the guide portion may be integrally formed with the ground member, or formed separately from the ground member, and may be electrically connected with the ground member.

In an embodiment, the deformation portion may be formed in a tapered shape having a decreasing diameter toward the bottom.

In an embodiment, the deformation portion may be formed in a rounded shape, the vertical cross-section of which has a decreasing diameter toward the bottom.

In an embodiment, the first diameter may be five to eight times greater than the first gap.

In an embodiment, the first gap may be greater than the third diameter by 10 mm or more.

In an embodiment, the second diameter may be six to eight times greater than the second gap.

According to an embodiment, a substrate support unit provided in an apparatus for treating a substrate using plasma includes a dielectric plate on which the substrate is placed, a lower electrode that is disposed under the dielectric plate and that has a first diameter, a power supply rod that applies RF power to the lower electrode and has a second diameter, and a ground member disposed under the lower electrode and spaced apart from the lower electrode by a first gap by an insulating member, the ground member including a plate portion having a through-hole formed therein through which the power supply rod passes, in which the through-hole has a third diameter. The ground member further includes a guide portion extending upward from an inner diameter of the through-hole by a predetermined length and spaced apart from the power supply rod by a second gap.

In an embodiment, the guide portion may be integrally formed with the ground member, or formed separately from the ground member, and may be electrically connected with the ground member.

In an embodiment, the first diameter may be five to eight times greater than the first gap.

In an embodiment, the first gap may be greater than the third diameter by 10 mm or more.

In an embodiment, the second diameter may be six to eight times greater than the second gap.

According to an embodiment, a substrate support unit provided in an apparatus for treating a substrate using plasma includes a dielectric plate on which the substrate is placed, a lower electrode that is disposed under the dielectric plate and that has a first diameter, a power supply rod that applies RF power to the lower electrode and has a second diameter, and a ground member disposed under the lower electrode and spaced apart from the lower electrode by a first gap by an insulating member, the ground member including a plate portion having a through-hole formed therein through which the power supply rod passes, in which the through-hole has a third diameter. The first gap is increased farther away from the power supply rod.

In an embodiment, an upper surface of the plate portion of the ground member may be formed such that an inner area and an outer area have different heights.

In an embodiment, the upper surface of the plate portion may have a decreasing height from the inner area toward the outer area.

In an embodiment, the substrate support unit may further include a guide portion extending upward from an inner diameter of the through-hole by a predetermined length and spaced apart from the power supply rod by a second gap.

In an embodiment, the lower electrode may include a deformation portion extending downward from a center of a lower surface of the lower electrode and having a decreasing diameter toward the bottom, and the power supply rod may be coupled to an end portion of the deformation portion.

According to an embodiment, an apparatus for treating a substrate includes a chamber having a process space inside, a support unit that supports the substrate in the process space, a gas supply unit that supplies a gas into the process space, and a plasma source that generates plasma from the gas. The support unit includes a dielectric plate on which the substrate is placed, a lower electrode that is disposed under the dielectric plate and that has a first diameter, a power supply rod that applies RF power to the lower electrode and has a second diameter, and a ground member disposed under the lower electrode and spaced apart from the lower electrode by a first gap by an insulating member, the ground member including a plate portion having a through-hole formed therein through which the power supply rod passes, in which the through-hole has a third diameter. The lower electrode includes a deformation portion extending downward from a center of a lower surface of the lower electrode and having a decreasing diameter toward the bottom, and the power supply rod is coupled to an end portion of the deformation portion. The ground member further includes a guide portion extending upward from an inner diameter of the through-hole by a predetermined length and spaced apart from the power supply rod by a second gap, and the guide portion is integrally formed with the ground member, or formed separately from the ground member, and is electrically connected with the ground member. The first gap is increased farther away from the power supply rod.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
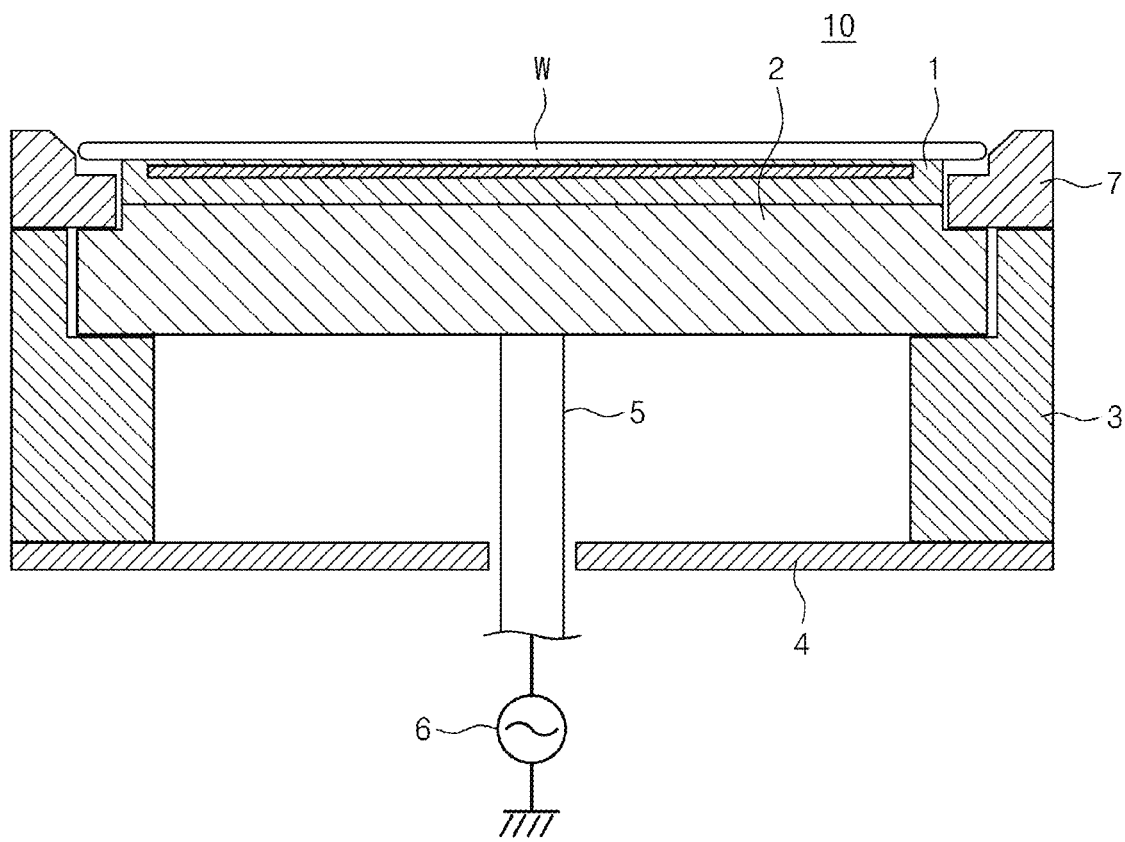
FIG. 1 is a view illustrating part of a support unit supporting a substrate in a conventional apparatus for treating the substrate using plasma.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

The inventive concept may, however, be embodied in different forms and should not be construed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

Hereinafter, a substrate treating apparatus for etching a substrate using plasma according to an embodiment of the inventive concept will be described. However, without being limited thereto, the inventive concept is applicable to various types of apparatuses for performing processes by supplying plasma into chambers.

Figure 2:
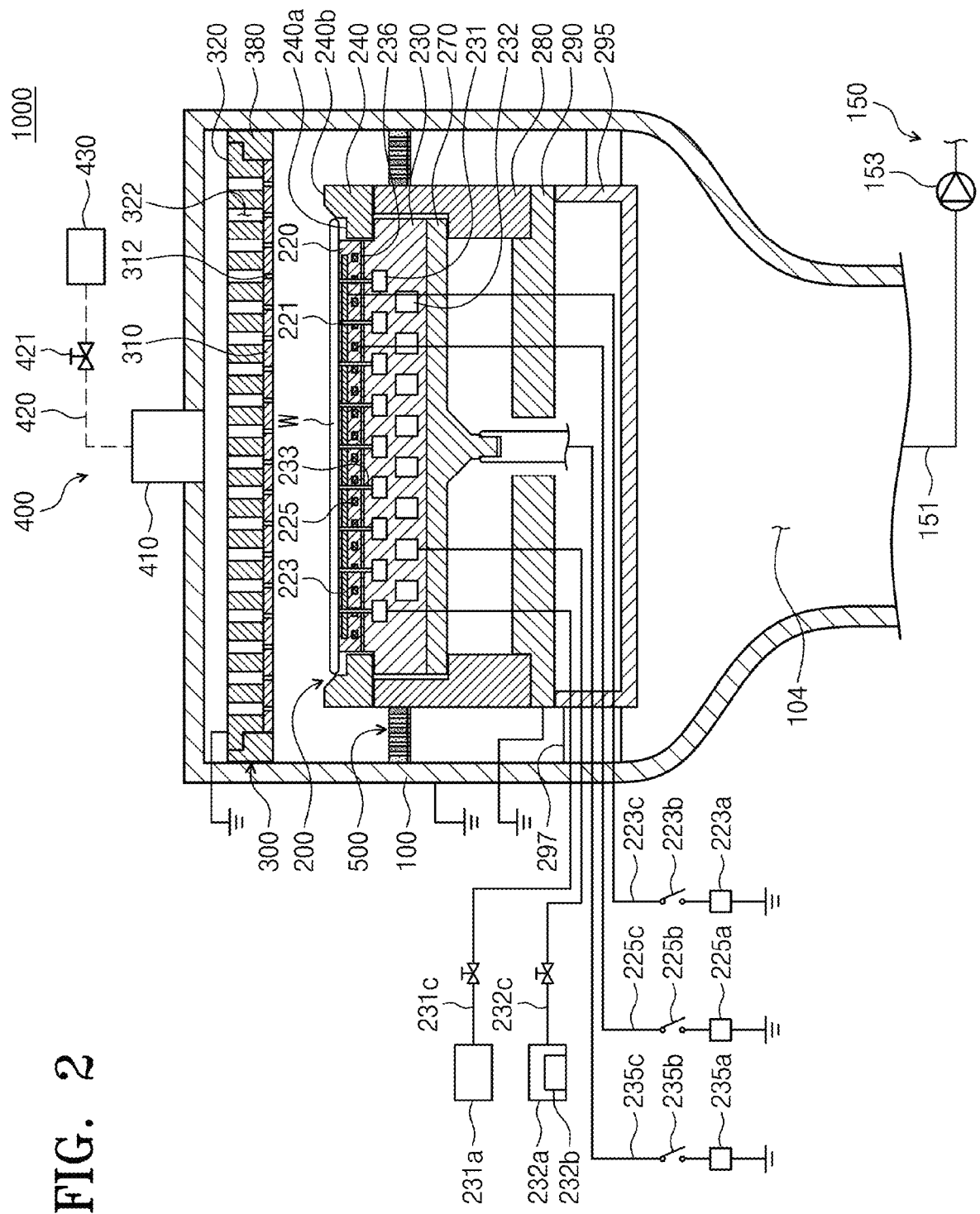
FIG. 2 is a view illustrating a substrate treating apparatus according to an embodiment of the inventive concept and a substrate support unit according to a first embodiment provided therein.
Figure 3:
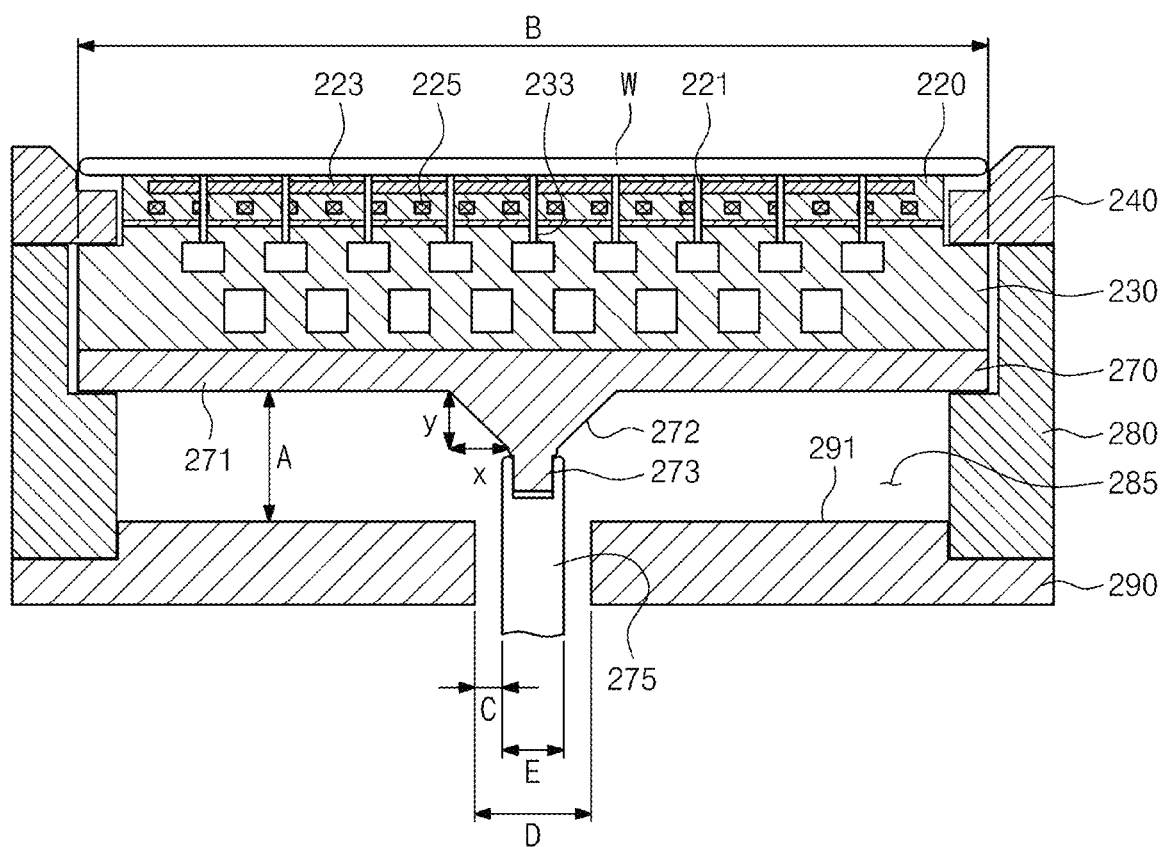
FIG. 3 is an enlarged sectional view of the substrate support unit according to the first embodiment illustrated in FIG. 2.

FIG. 2 is a view illustrating a substrate treating apparatus according to an embodiment of the inventive concept and a substrate support unit according to a first embodiment provided therein, and FIG. 3 is an enlarged sectional view of the substrate support unit according to the first embodiment illustrated in FIG. 2. Referring to FIGS. 2 and 3, the substrate treating apparatus 1000 treats a substrate W using plasma. The substrate treating apparatus 1000 includes a chamber 100, the substrate support unit 200, a showerhead unit 300, a gas supply unit 400, a plasma source, a liner unit (not illustrated), a baffle unit 500, and a controller (not illustrated).

The chamber 100 has a process space therein in which a substrate treating process is performed. The chamber 100 is provided in an enclosed shape. The chamber 100 may be formed of a conductive material. For example, the chamber 100 may be formed of a material containing metal. The chamber 100 may be formed of an aluminum material. The chamber 100 may be grounded. The chamber 100 has an exhaust hole 104 formed in the bottom thereof. The exhaust hole 104 is connected with an exhaust line 151. The exhaust line 151 is connected with a pump 153. Reaction byproducts generated in the substrate treating process and gases staying in the inner space of the chamber 100 may be realeased to the outside through the exhause line 151. The pursser in the chamber 100 is reduced to a predetermined pressure by the exhause process. Alternatively, a sparate pressure-reducing member may be provided to reduce the pressure in the process space 102 to the predetermined pressure.

A heater (not illustrated) may be provided inside a wall of the chamber 100. The heater heats the wall of the chamber 100. The heater is electrically connected with a heating power supply (not illustrated). The heater generates heat by resisting an electric current applied by the heating power supply. The heat generated from the heater is transferred to the inner space. The temperature in the process space is maintained at a predetermined temperature by the heat generated from the heater. The heater may be implemented with a heating wire having a coil shape. A plurality of heaters may be provided inside the wall of the chamber 100.

The substrate support unit 200 is located in the chamber 100. The substrate support unit 200 supports the substrate W in the process space. The substrate support unit 200 may include an electrostatic chuck (ESC) that electro-statically clamps the substrate W using an electrostatic force. Alternatively, the substrate support unit 200 may support the substrate W in various manners such as mechanical clamping. Hereinafter, the substrate support unit 200 including the electrostatic chuck (ESC) will be described.

The substrate support unit 200 includes a dielectric plate 220, a body plate 230, a focus ring 240, an RF support plate 270, an insulating cover 280, a ground member 290, and a lower cover 295. The substrate support unit 200 may be located in the chamber 100 and may be spaced apart upward from the bottom of the chamber 100.

The dielectric plate 220 is located at the top of the substrate support unit 200. The dielectric plate 220 is formed of a dielectric substance having a circular plate shape. The substrate W is placed on the upper surface of the dielectric plate 220. The upper surface of the dielectric plate 220 has a smaller radius than the substrate W. Thus, the edge region of the substrate W is located outside the dielectric plate 220. The dielectric plate 220 has a first supply passage 221 formed therein. The first supply passage 221 extends from the upper surface of the dielectric plate 220 to the bottom surface thereof. A plurality of first supply passages 221 are formed to be spaced apart from each other. The first supply passages 221 serve as passages through which a heat transfer medium is supplied to the bottom surface of the substrate W.

An electrostatic electrode 223 and a heater 225 are buried in the dielectric plate 220. The electrostatic electrode 223 is located over the heater 225. The electrostatic electrode 223 is electrically connected with a first lower power supply 223a. The first lower power supply 223a includes a direct current (DC) power supply. A switch 223b is installed between the electrostatic electrode 223 and the first lower power supply 223a. The electrostatic electrode 223 may be electrically connected with, or disconnected from, the first lower power supply 223a by turning on or off the switch 223b. When the switch 223b is turned on, a DC current is applied to the electrostatic electrode 223. An electrostatic force acts between the electrostatic electrode 223 and the substrate W due to electric current applied to the electrostatic electrode 223, and the substrate W is clamped to the dielectric plate 220 by the electrostatic force.

The heater 225 is electrically connected with a second lower power supply 225a. The heater 225 generates heat by resisting an electric current applied by the second lower power supply 225a. The generated heat is transferred to the substrate W through the dielectric plate 220. The substrate W is maintained at a predetermined temperature by the heat generated from the heater 225. The heater 225 includes a spiral coil.

The body plate 230 is located under the dielectric plate 220. The bottom surface of the dielectric plate 220 and the upper surface of the body plate 230 may be attached to each other by an adhesive 236. The body plate 230 may be formed of an aluminum material. The upper surface of the body plate 230 may have a step such that the central region is located in a higher position than the edge region. The central region of the upper surface of the body plate 230 has an area corresponding to the bottom surface of the dielectric plate 220 and is attached to the bottom surface of the dielectric plate 220. The support plate 230 has a first circulation passage 231, a second circulation passage 232, and a second supply passage 233 formed therein.

The body plate 230 may include a metal plate. The body plate 230 may be connected with an RF power supply 620 by an RF transmission line 610. Power may be applied from the RF power supply 620 to the body plate 230, and the body plate 230 may allow plasma generated in the process space to be effectively supplied to the substrate W. That is, the body plate 230 may function as an electrode. In FIG. 2, the substrate treating apparatus 1000 is implemented in a CCP type. However, without being limited thereto, the substrate treating apparatus 1000 according to an embodiment of the inventive concept may be implemented in an ICP type. When the substrate treating apparatus 1000 is implemented in an ICP type, the RF transmission line 610 may be connected to a lower electrode for generating plasma and may apply power from the RF power supply 620 to the lower electrode.

The first circulation passage 231 serves as a passage through which the heat transfer medium circulates. The first circulation passage 231 may be formed in a spiral shape inside the body plate 230. Alternatively, the first circulation passage 231 may be implemented with ring-shaped passages that have different radii and that are concentric with one another. The first circulation passages 231 may be fluidly connected together. The first circulation passages 231 are formed at the same height.

The second circulation passage 232 serves as a passage through which a cooling fluid circulates. The second circulation passage 232 may be formed in a spiral shape inside the body plate 230. Alternatively, the second circulation passage 232 may be implemented with ring-shaped passages that have different radii and that are concentric with one another. The second circulation passages 232 may be fluidly connected together. The second circulation passages 232 may have a larger cross-sectional area than the first circulation passages 231. The second circulation passages 232 are formed at the same height. The second circulation passages 232 may be located under the first circulation passages 231.

The second supply passage 233 extends upward from the first circulation passages 231 to the upper surface of the body plate 230. As many second supply passages 243 as the first supply passages 221 are provided. The second supply passages 231 connect the first circulation passages 231 and the first supply passages 221.

The first circulation passages 231 are connected to a heat transfer medium reservoir 231a through a heat transfer medium supply line 231b. The heat transfer medium reservoir 231a has the heat transfer medium stored therein. The heat transfer medium includes an inert gas. According to an embodiment, the heat transfer medium includes a helium (He) gas. The helium gas is supplied into the first circulation passages 231 through the heat transfer medium supply line 231b. The helium gas sequentially passes through the second supply passage 233 and the first supply passage 221 and is supplied to the bottom surface of the substrate W. The helium gas serves as a medium through which heat transferred from plasma to the substrate W is transferred to the electrostatic chuck.

The second circulation passages 232 are connected with a cooling fluid reservoir 232a through a cooling fluid supply line 232c. The cooling fluid reservoir 232a has the cooling fluid stored therein. The cooling fluid reservoir 232a may include a cooler 232b therein. The cooler 232b cools the cooling fluid to a predetermined temperature. Alternatively, the cooler 232b may be disposed in-line with the cooling fluid supply line 232c. The cooling fluid supplied into the second circulation passages 232 through the cooling fluid supply line 232c cools the body plate 230 while circulating along the second circulation passages 232. The body plate 230, while being cooled, cools the dielectric plate 220 and the substrate W together to maintain the substrate W at a predetermined temperature.

The focus ring 240 is disposed on the edge region of the electrostatic chuck. The focus ring 240 has a ring shape and is disposed around the dielectric plate 220. Furthermore, the focus ring 240 may be disposed on the upper surface of the insulating cover 280. The upper surface of the focus ring 240 may have a step such that an outer portion 240a is located in a higher position than an inner portion 240b. The inner portion 240b of the upper surface of the focus ring 240 is located at the same height as the upper surface of the dielectric plate 220. The inner portion 240b of the upper surface of the focus ring 240 supports the edge region of the substrate W located outside the dielectric plate 220. The outer portion 240a of the focus ring 240 surrounds the edge region of the substrate W. The focus ring 240 allows plasma to be concentrated on the region opposite the substrate W in the chamber 100.

An air gap 285 is formed under the body plate 230. The air gap 285 is formed between the RF support plate 270 and the ground member 290 to be described below. The air gap 285 may be surrounded by the insulating cover 280. The air gap 285 electrically insulates the RF support plate 270 and the ground member 290.

The RF support plate 270 is provided under the body plate 230. The upper surface of the RF support plate 270 is brought into contact with the lower surface of the body plate 230. The RF support plate 270 may have a circular plate shape. The RF support plate 270 is formed of a conductive material. For example, the RF support plate 270 may be formed of an aluminum material.

The RF support plate 270 includes an electrode plate portion 721, a deformation portion 272, and a rod coupling portion 273. The flat surface of the electrode plate portion 271 may have a shape corresponding to the shape of the flat surface of the body plate 230. The deformation portion 272 extends downward from the center of the electrode plate portion 271. The deformation part 272 may have a gradually decreasing diameter from the top toward the bottom. The rod coupling portion 273 extends from the bottom of the deformation portion 272.

A power supply rod 275 may apply power to the RF support plate 270. The power supply rod 275 may be electrically connected with the RF support plate 270. The power supply rod 275 may be connected with a lower power supply 227. The lower power supply 227 may be implemented with an RF power supply that generates RF power. The RF power supply may be a high bias power RF power supply. The lower power supply 227 may include a plurality of RF power supplies. The plurality of RF power supplies may be implemented by a combination of one or more of a high frequency (27.12 MHz or more), an intermediate frequency (1 MHz to 27.12 MHz), and a low frequency (100 KHz to 1 MHz). The power supply rod 275 receives RF power from the lower power supply 227. The power supply rod 275 may be formed of a conductive material. For example, the power supply rod 275 may be formed of a material containing metal. The power supply rod 275 may be a metal rod. Furthermore, the power supply rod 275 may be connected with a matcher (not illustrated). A third lower power supply 235a and the power supply rod 275 may be connected through the matcher (not illustrated). The matcher (not illustrated) may perform impedance matching.

The insulating cover 280 supports the RF support plate 270. The insulating cover 280 may be provided in contact with the side surface of the RF support plate 270. The insulating cover 280 may be provided in contact with the edge region of the lower surface of the RF support plate 270. For example, the insulating cover 280 may have a cylindrical shape that is open at the top and the bottom. Furthermore, the insulating cover 280 may have a step on the inside thereof such that the RF support plate 270 is supported by the insulating cover 280. The insulating cover 280 may be formed of an insulating material.

The ground member 290 is an electrically grounded component. The ground member 290 may have, in the center thereof, a through-hole through which the power supply rod 275 passes.

The lower cover 295 is located at the bottom of the substrate support unit 200. The lower cover 295 is spaced apart upward from the bottom of the chamber 100. The lower cover 295 has a space formed therein, which is open at the top. The upper surface of the lower cover 295 is covered by the ground member 290. Accordingly, the outer diameter of the cross-section of the lower cover 295 may be equal to the outer diameter of the ground member 290. The lower cover 295 may have, in the inner space thereof, a lift pin module (not illustrated) that moves the substrate W from an external transfer member to a substrate support surface corresponding to the upper surface of the substrate support member 200.

The lower cover 295 includes a connecting member 297. The connecting member 297 connects the outside surface of the lower cover 295 and the inner wall of the chamber 100. A plurality of connecting members 297 may be provided at predetermined intervals on the outside surface of the lower cover 295. The connecting members 297 support the substrate support unit 200 inside the chamber 100. Furthermore, the connecting members 297 are connected to the inner wall of the chamber 100 to allow the lower cover 295 to be electrically grounded. A first power line 223c connected with the first lower power supply 223a, a second power line 225c connected with the second lower power supply 225a, the heat transfer medium supply line 231b connected with the heat transfer medium reservoir 231a, and the cooling fluid supply line 232c connected with the cooling fluid reservoir 232a extend into the lower cover 295 through the inner spaces of the connecting members 297.

The lower cover 295 is disposed under the insulating cover 280. The lower cover 295 disposed under the insulating cover 280 supports the insulating cover 280. The lower cover 295 may be formed of a conductive material. For example, the lower cover 295 may be formed of a material containing metal. The lower cover 295 may be electrically connected with the chamber 100. The lower cover 295 may be electrically grounded.

Recently, among technologies for optimizing the power supply rod 275 for applying high power, studies using the electromagnetic characteristics of RF have been conducted. In particular, studies for optimizing divergence of RF power supplied to the substrate support unit through the power supply rod 275 have been conducted. This is because the inventors of the inventive concept determine that the divergence direction of RF power effectively acts in efficiently delivering RF. In other words, this is because the inventors of the inventive concept determine that when power is applied to a portion where divergence of RF power is easily performed, it is possible to easily find a point where impedance resistance is low. It is predicted that the characteristics of RF feeding can be used well through the shape used in radar or electromagnetic communication.

In FIG. 3, "A" means the gap between the bottom surface of the electrode plate portion 271 of the RF support plate 270 and the upper surface of the plate portion 291 of the ground member 290. "B" means the diameter of the electrode plate portion 271. "C" means the separation gap between the inner wall of the through-hole formed in the plate portion 291 and the power supply rod 275. "D" means the inner diameter of the through-hole formed in the plate portion 291. "E" means the diameter of the power supply rod 275. The inventors of the inventive concept want to set specific dimensions of components constituting the substrate support unit. The specific dimensions of the components constituting the substrate support unit are defined as follows.

Size Definition

1. D<A, A is greater than D by 10 mm or more.
2. B=A×(5 to 8), A is 5 to 8 times smaller than the diameter B of the electrode plate portion 271 of the RF support plate 270 in view of impedance efficiency and size.
3. C×(6 to 8)<E
4. E is determined in the range of 20 mm to 40 mm in consideration of the frequency and power of RF power.
5. (2×C)+E=D The following equations are used to calculate an inductance value and a capacitance value to raise the efficiency of RF power.

$$X_L = 2\pi FL, \quad X_C = 1/2\pi FC \qquad \text{[Equation 1]}$$

Basic impedance may be obtained through Equation 1, and L and C may be obtained through the coaxial line formula.

$$L = \frac{\mu l}{2\pi} * \left[\frac{1}{4} + \ln\left(\frac{b}{a}\right)\right]$$

$$L = \mu l/2\pi * [1/4 + \ln(b/a)] \qquad \text{[Equation 3]}$$

$$C = Q/V = \epsilon * 2\pi l/\ln(b/a) \qquad \text{[Equation 4]}$$

Equation 2 is an equation for calculating characteristic impedance. Equation 3 is an equation for calculating the inductance of the power supply rod 275. Equation 4 is an equation for calculating the stray capacitance of the power supply rod 275.

Comparing the conventional case in which as illustrated in FIG. 1, the corner is formed at the portion where the lower electrode 2 and the RF rod 5 are connected and the embodiment of the inventive concept in which the lower portion of the RF support plate 270 (in the embodiment, the RF support plate 270 and the body plate 230 function as a lower electrode as the body plate 230 and the RF support plate 270 are electrically connected) has a gradually decreasing diameter toward the bottom (e.g., is formed in a fillet or chamfer shape), the embodiment of the inventive concept may lower the inductance value for the length of the power supply rod 275 and may raise the capacitance value, when RF wave energy travels along the power supply rod 275. It can be seen that this is an important factor in adjustment of impedance and control of an upper field.

When the deformation portion 272 is provided in a chamfer shape in the first embodiment, the distance x or y of the chamfer, which is a chamfer value, may be defined as follows.

$$C \text{ (mm)} < \text{the distance } x \text{ or } y \text{ (mm) of the chamfer} < C \times 20 \text{ (mm)}$$

Here, the chamfer angle ranges between 0° and 90°. Meanwhile, when the deformation portion 272 is provided in a chamfer shape, the x value and the y value may differ from each other.

Meanwhile, the deformation portion 272 may be implemented with a deformation portion 2272, the vertical cross-section of which is tapered in a rounded shape as will be described below with reference to FIG. 7. Detailed description thereabout will be given below with reference to FIG. 7.

Figure 4:
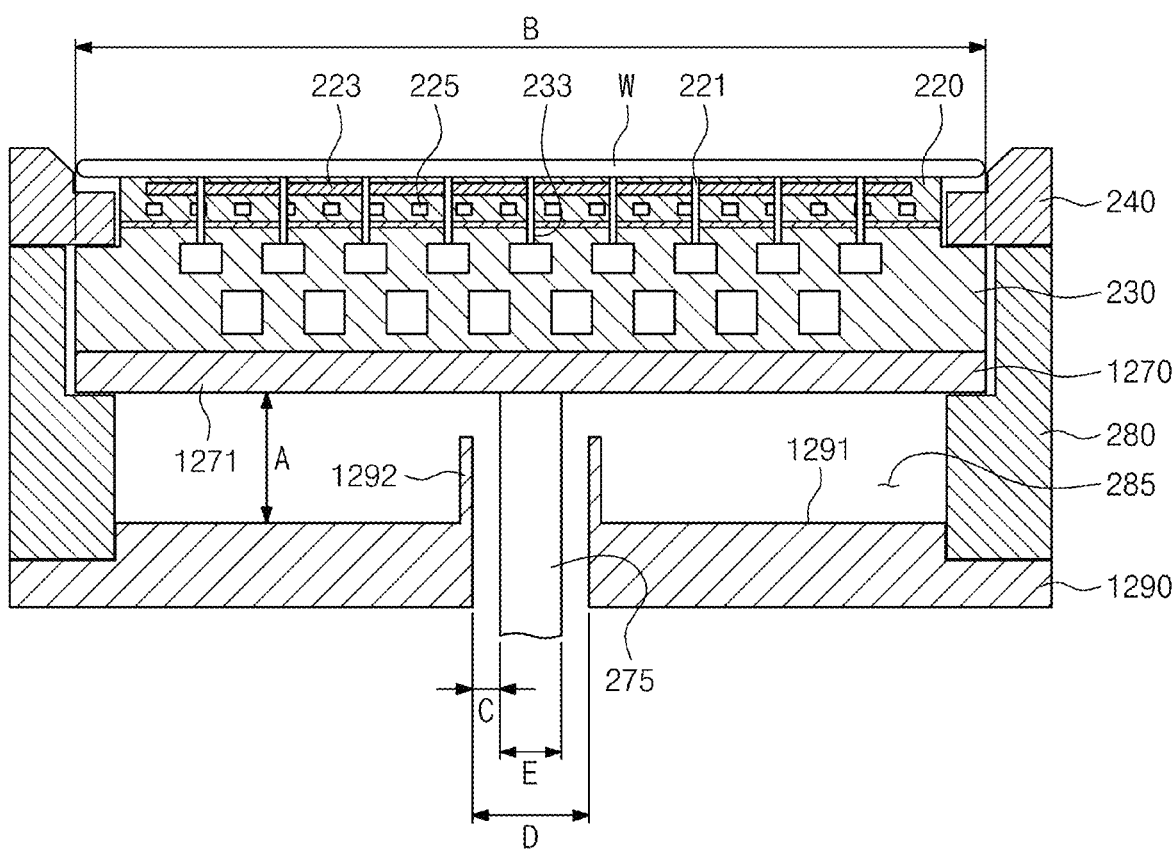
FIG. 4 is a sectional view of a substrate support unit according to a second embodiment.

FIG. 4 is a sectional view of a substrate support unit according to a second embodiment provided in the substrate treating apparatus of FIG. 2. The substrate support unit according to the second embodiment will be described below with reference to FIG. 4. Components identical to the components described above with reference to FIGS. 2 and 3 will be assigned with identical reference numerals, and the foregoing descriptions set forth in conjunction with FIGS. 2 and 3 may be identically applied to the components having the identical reference numerals.

Referring to FIG. 4, an RF support plate 1270 including an electrode plate portion 1271 is provided, and a power supply rod 275 is connected to the RF support plate 1270.

An air gap 285 is formed under the RF support plate 1270. The air gap 285 is formed between the RF support plate 1270 and a ground member 1290 to be described below. The air gap 285 may be surrounded by an insulating cover 280. The air gap 285 electrically insulates the RF support plate 1270 and the ground member 1290.

The ground member 1290 is an electrically grounded component. The ground member 1290 includes a plate portion 1291, and the plate portion 1291 has, in the center thereof, a through-hole through which the power supply rod 275 passes. A guide portion 1292 extends toward the air gap 285 from the inner diameter of the through-hole formed in the center of the ground member 1290. The guide portion 1292 is spaced apart from the power supply rod 275 by a set distance and surrounds the power supply rod 275.

The guide portion 1292 serves to uniformly deliver RF energy upward. When the guide portion 1292 is not provided, plasma uniformity is not good, as compared with when the guide portion 1292 is provided. Accordingly, a process result is poor. The inventors of the inventive concept have discovered that when the guide portion 1292 is not provided, RF energy is delivered to the plate portion 1291 of the ground member 1290 due to the radiation of the RF energy and the plate portion 1291 fails to correctly serve as a ground to a degree that the RF energy delivered to the plate portion 1291 causes noise in the space in which the substrate W is treated. The inventors of the inventive concept recognize that there is a trade-off between energy loss by the guide portion 1292 in a delivery process of RF power when the guide portion 1292 is provided as in the second embodiment of the inventive concept and advantages of the inventive concept. However, the inventors recognize that the inventive concept meets the recent scaling-down trend and has a commercial value in that high-quality processing is possible due to an effect that plasma uniformity is raised by suppression of noise by the guide portion 1292.

In FIG. 4, "A" means the gap between the bottom surface of the electrode plate portion 1271 of the RF support plate 1270 and the upper surface of the plate portion 1291 of the ground member 1290. "B" means the diameter of the electrode plate portion 1271. "C" means the separation gap between the inner wall of the guide portion 1292 and the power supply rod 275. "D" means the inner diameter of the guide portion 1292. "E" means the diameter of the power supply rod 275. The inventors of the inventive concept want to set specific dimensions of components constituting the substrate support unit. The specific dimensions of the components constituting the substrate support unit are defined as follows.

Size Definition

Figure 5:
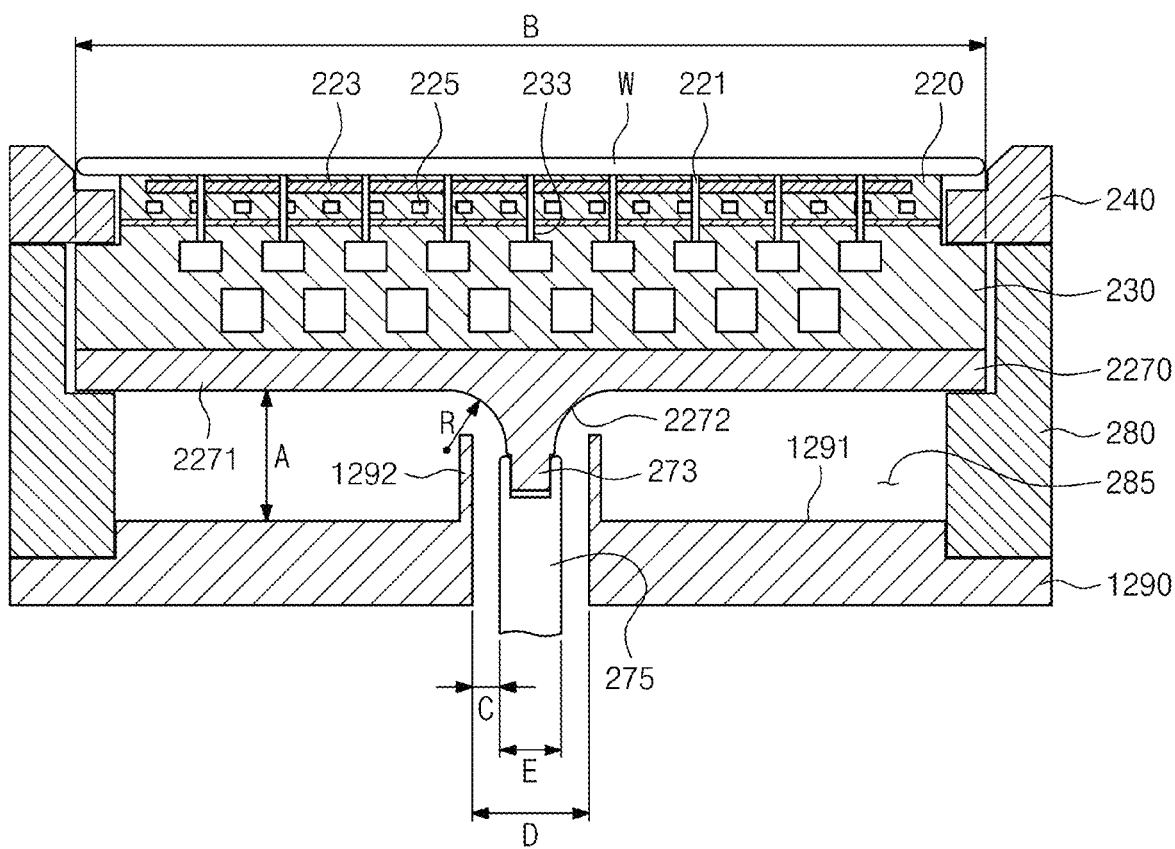
FIG. 5 is a sectional view of a substrate support unit according to a third embodiment.

1. D<A, A is greater than D by 10 mm or more.
2. B=A×(5 to 8), A is 5 to 8 times smaller than the diameter B of the electrode plate portion 1271 of the RF support plate 1270 in view of impedance efficiency and size.
3. C×(6 to 8)<E
4. E is determined in the range of 20 mm to 40 mm in consideration of the frequency and power of RF power.
5. (2×C)+E=D FIG. 5 is a sectional view of a substrate support unit according to a third embodiment provided in the substrate treating apparatus of FIG. 2. The substrate support unit according to the third embodiment will be described below with reference to FIG. 5. Components identical to the components described above with reference to FIGS. 2 to 4 will be assigned with identical reference numerals, and the foregoing descriptions set forth in conjunction with FIGS. 2 to 4 may be identically applied to the components having the identical reference numerals.

Referring to FIG. 5, an RF support plate 2270 including an electrode plate portion 2271 is provided, and a deformation portion 2272 protrudes from the bottom of the electrode plate portion 2271. The deformation portion 2272 may have a vertical cross-section tapered in a rounded shape. A rod coupling portion 273 extends downward from the bottom of the deformation portion 2272. A power supply rod 275 is coupled and electrically connected with the rod coupling portion 273.

An air gap 285 is formed under the RF support plate 2270. The air gap 285 is formed between the RF support plate 2270 and a ground member 1290 to be described below. The air gap 285 may be surrounded by an insulating cover 280. The air gap 285 electrically insulates the RF support plate 2270 and the ground member 1290.

The ground member 1290 is an electrically grounded component. The ground member 1290 includes a plate portion 1291. The plate portion 1291 has, in the center thereof, a through-hole through which the power supply rod 275 passes. A guide portion 1292 extends toward the air gap 285 from the inner diameter of the through-hole formed in the center of the ground member 1290. The guide portion 1292 is formed to surround the power supply rod 275.

The guide portion 1292 serves to uniformly deliver RF energy upward. Meanwhile, as described above, there is a trade-off between energy loss by the guide portion 1292 in a delivery process of RF energy and advantages of the inventive concept. The guide portion 1292 may be located in a higher position than the position where the power supply rod 275 is coupled to the RF support plate 2270. However, the guide portion 1292 may be appropriately designed in consideration of the trade-off relationship with the energy loss.

In FIG. 5, "A" means the gap between the bottom surface of the electrode plate portion 2271 of the RF support plate 2270 and the upper surface of the plate portion 1291 of the ground member 1290. "B" means the diameter of the electrode plate portion 2271. "C" means the separation gap between the inner wall of the guide portion 1292 and the power supply rod 275. "D" means the inner diameter of the guide portion 1292. "E" means the diameter of the power supply rod 275. The inventors of the inventive concept want to set specific dimensions of components constituting the substrate support unit. The specific dimensions of the components constituting the substrate support unit are defined as follows.

Size Definition

1. D<A, A is greater than D by 10 mm or more.
2. B=A×(5 to 8), A is 5 to 8 times smaller than the diameter B of the electrode plate portion 2271 of the RF support plate 2270 in view of impedance efficiency and size.
3. C×(6 to 8)≤E
4. E is determined in the range of 20 mm to 40 mm in consideration of the frequency and power of RF power.
5. (2×C)+E=D The R value of the vertical cross-section of the deformation portion 2272 tapered in a rounded shape (the radius of the curved surface forming the rounded portion) may be defined as follows.

$C$ (mm)<the radius $R$ (mm) of the curved surface forming the rounded portion<$C$×20 (mm)

Here, the round angle of the deformation portion 2272 in a rounded shape ranges between 0° and 90°.

Figure 6:
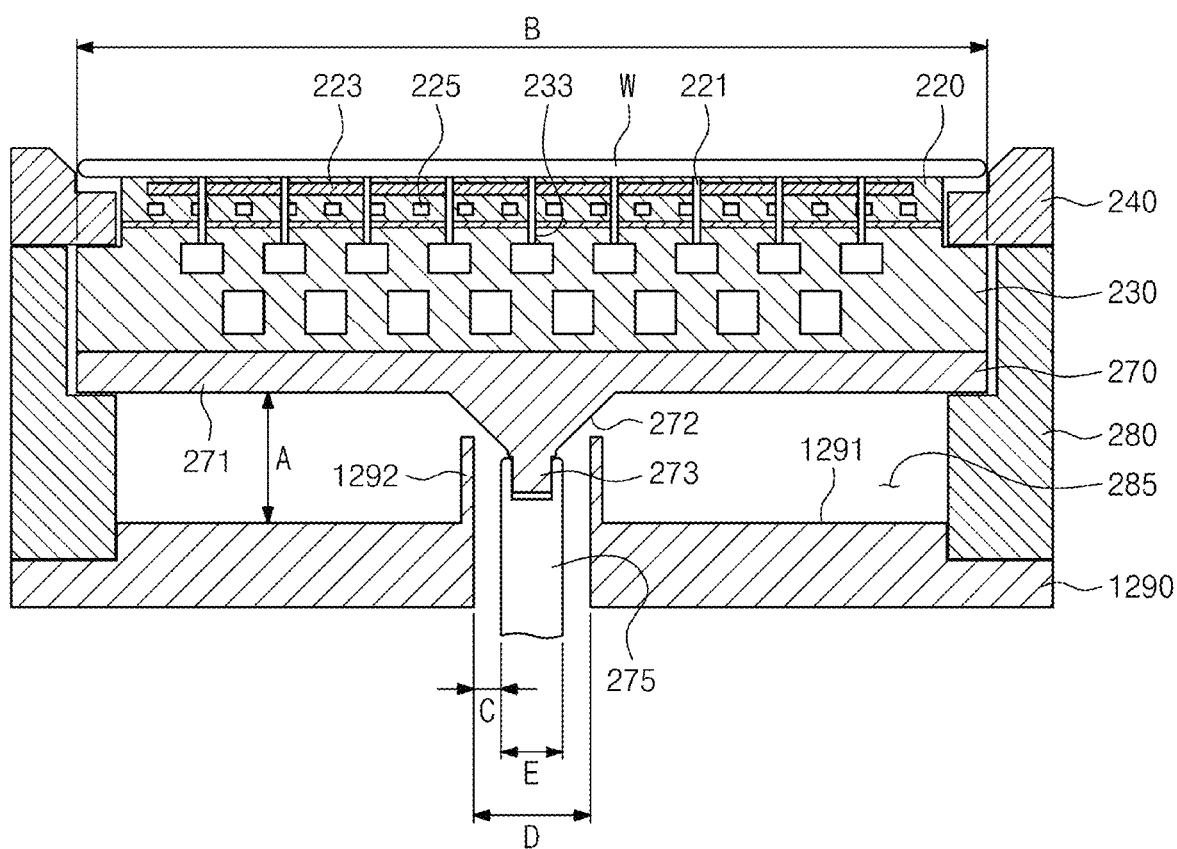
FIG. 6 is a sectional view of a substrate support unit according to a fourth embodiment.

FIG. 6 is a sectional view of a substrate support unit according to a fourth embodiment provided in the substrate treating apparatus of FIG. 2. The substrate support unit according to the fourth embodiment will be described below with reference to FIG. 6. Components identical to the components described above with reference to FIGS. 2 to 5 will be assigned with identical reference numerals, and the foregoing descriptions set forth in conjunction with FIGS. 2 to 5 may be identically applied to the components having the identical reference numerals.

Referring to FIG. 6, a deformation portion 272 is provided in a chamfer shape on the bottom of an electrode plate portion 271 of an RF support plate 270. A guide portion 1292 extends toward an air gap 285 from the inner diameter of a through-hole formed in the center of a ground member 1290. The guide portion 1292 is formed to surround a power supply rod 275.

The guide portion 1292 serves to uniformly deliver RF energy upward. Meanwhile, as described above, there is a trade-off between energy loss by the guide portion 1292 in a delivery process of RF energy and advantages of the inventive concept. The guide portion 1292 may be located in a higher position than the position where the power supply rod 275 is coupled to the RF support plate 270. However, the guide portion 1292 may be appropriately designed in consideration of the trade-off relationship with the energy loss.

Figure 7:
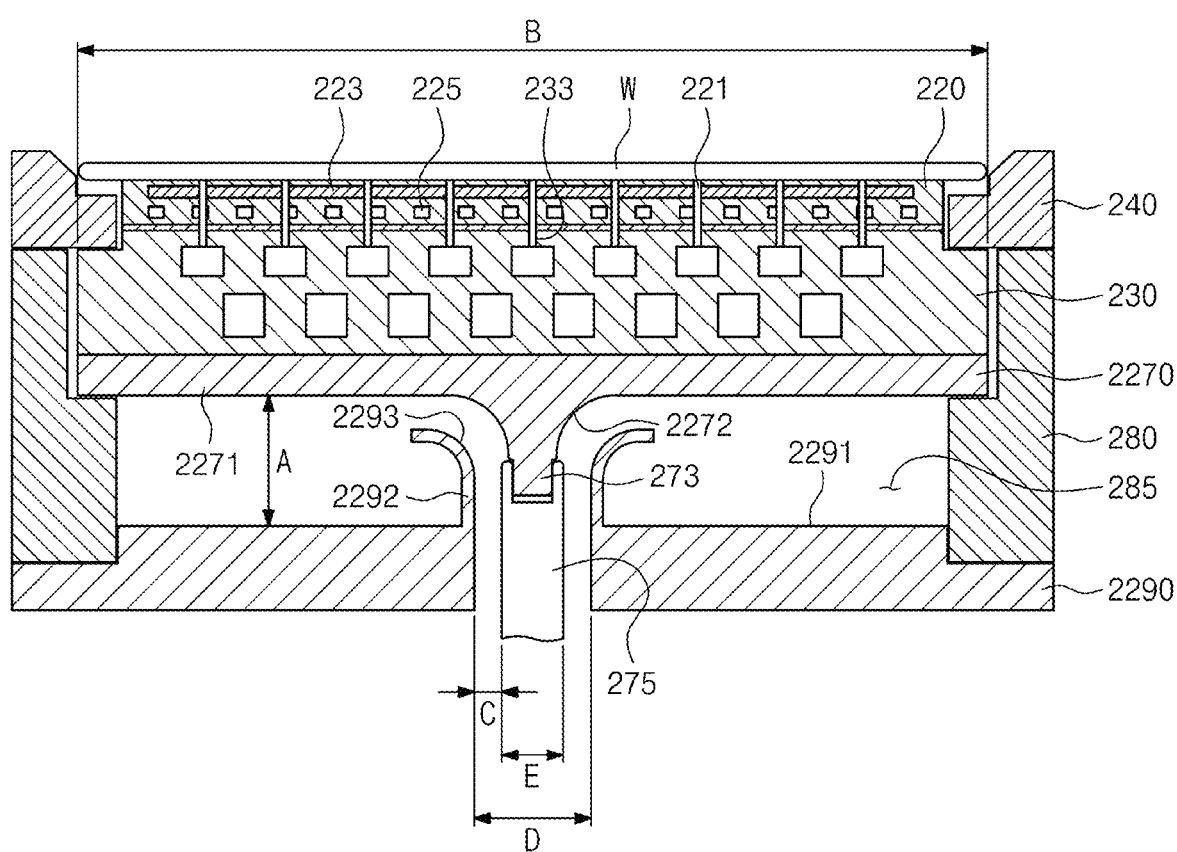
FIG. 7 is a sectional view of a substrate support unit according to a fifth embodiment.

FIG. 7 is a sectional view of a substrate support unit according to a fifth embodiment provided in the substrate treating apparatus of FIG. 2. The substrate support unit according to the fifth embodiment will be described below with reference to FIG. 7. Components identical to the components described above with reference to FIGS. 2 to 6 will be assigned with identical reference numerals, and the foregoing descriptions set forth in conjunction with FIGS. 2 to 6 may be identically applied to the components having the identical reference numerals.

Referring to FIG. 7, an RF support plate 2270 including an electrode plate portion 2271 is provided, and a deformation portion 2272 protrudes from the bottom of the electrode plate portion 2271. The deformation portion 2272 may have a vertical cross-section tapered in a rounded shape. A rod coupling portion 273 extends downward from the bottom of the deformation portion 272. A power supply rod 275 is coupled and electrically connected with the rod coupling portion 273.

A ground member 2290 is an electrically grounded component. The ground member 2290 includes a plate portion 2291. The plate portion 2291 has, in the center thereof, a through-hole through which the power supply rod 275 passes. A guide portion 2292 extends toward an air gap 285 from the inner diameter of the through-hole formed in the center of the plate portion 2291. The guide portion 2292 is formed to surround the power supply rod 275, and the guide portion 2292 further includes an extension 2293. The extension 2293 is spaced apart from the deformation portion 2272 of the RF support plate 2270 and surrounds the deformation portion 2272. The extension 2293 may prevent RF energy collected in the deformation portion 2272 from being radiated to the plate portion 2291 of the ground member 2290. Accordingly, the guide portion 2292 serves to uniformly deliver RF energy upward while preventing the RF energy from being delivered to the plate portion 2291 to cause noise. Meanwhile, as described above, there is a trade-off between energy loss by the guide portion 2292 in a delivery process of RF energy and advantages of the inventive concept. However, the height or thickness of the guide portion 2292 may be appropriately designed in consideration of the trade-off relationship with the energy loss.

In FIG. 7, "A" means the gap between the bottom surface of the electrode plate portion 2271 of the RF support plate 2270 and the upper surface of the plate portion 2291 of the ground member 2290. "B" means the diameter of the electrode plate portion 2271. "C" means the separation gap between the inner wall of the guide portion 2292 and the power supply rod 275. "D" means the inner diameter of the guide portion 2292. "E" means the diameter of the power supply rod 275. The inventors of the inventive concept want to set specific dimensions of components constituting the substrate support unit. The specific dimensions of the components constituting the substrate support unit are defined as follows.

Size Definition

1. D<A, A is greater than D by 10 mm or more.
2. B=A×(5 to 8), A is 5 to 8 times smaller than the diameter B of the electrode plate portion 2271 of the RF support plate 2270 in view of impedance efficiency and size.
3. C×(6 to 8)<E
4. E is determined in the range of 20 mm to 40 mm in consideration of the frequency and power of RF power.
5. (2×C)+E=D The R value of the vertical cross-section of the deformation portion 2272 tapered in a rounded shape (the radius of the curved surface forming the rounded portion) may be defined as follows.

$C$ (mm)<the radius $R$ (mm) of the curved surface forming the rounded portion<$C$×20 (mm)

Here, the round angle of the deformation portion 2272 in a rounded shape ranges between 0° and 90°.

Figure 8:
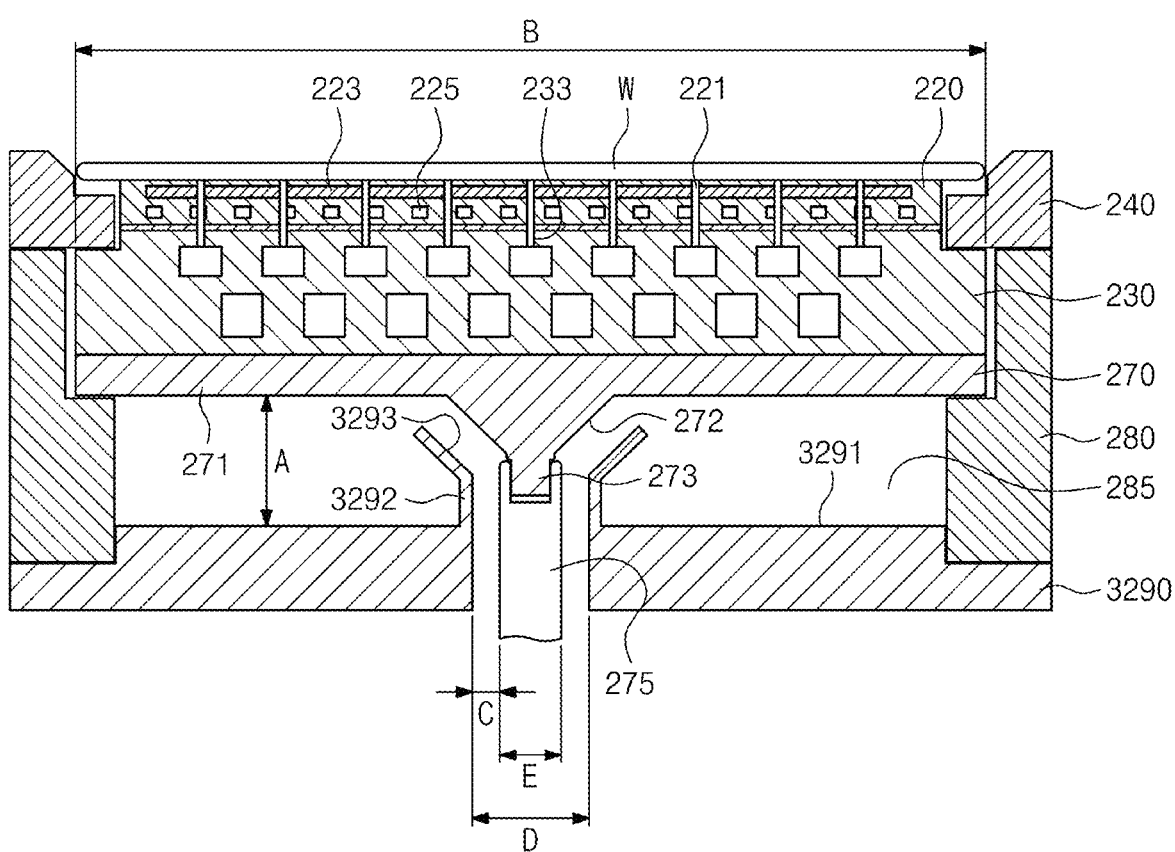
FIG. 8 is a sectional view of a substrate support unit according to a sixth embodiment.

FIG. 8 is a sectional view of a substrate support unit according to a sixth embodiment provided in the substrate treating apparatus of FIG. 2. The substrate support unit according to the sixth embodiment will be described below with reference to FIG. 8. Components identical to the components described above with reference to FIGS. 2 to 7 will be assigned with identical reference numerals, and the foregoing descriptions set forth in conjunction with FIGS. 2 to 7 may be identically applied to the components having the identical reference numerals.

Referring to FIG. 8, an RF support plate 270 including an electrode plate portion 271 is provided, and a deformation portion 272 protrudes from the bottom of the electrode plate portion 271. The deformation portion 272 may have a chamfer shape. A rod coupling portion 273 extends downward from the bottom of the deformation portion 272. A power supply rod 275 is coupled and electrically connected with the rod coupling portion 273.

A ground member 3290 is an electrically grounded component. The ground member 3290 has, in the center thereof, a through-hole through which the power supply rod 275 passes. A guide portion 3292 extends toward an air gap 285 from the inner diameter of the through-hole formed in the center of the ground member 3290. The guide portion 3292 is formed to surround the power supply rod 275, and the guide portion 3292 further includes an extension 3293. The extension 3293 is spaced apart from the deformation portion 272 of the RF support plate 270 and surrounds the deformation portion 272. The extension 3293 may prevent RF energy collected in the deformation portion 272 from being radiated to a plate portion 3291 of the ground member 3290. Accordingly, the guide portion 3292 serves to uniformly deliver RF energy upward while preventing the RF energy from being delivered to the plate portion 3291 to cause noise. Meanwhile, as described above, there is a trade-off between energy loss by the guide portion 3292 in a delivery process of RF energy and advantages of the inventive concept. However, the height or thickness of the guide portion 3292 may be appropriately designed in consideration of the trade-off relationship with the energy loss.

In FIG. 8, "A" means the gap between the bottom surface of the electrode plate portion 271 of the RF support plate 270 and the upper surface of the plate portion 3291 of the ground member 3290. "B" means the diameter of the electrode plate portion 271. "C" means the separation gap between the inner wall of the guide portion 3292 and the power supply rod 275. "D" means the inner diameter of the guide portion 3292. "E" means the diameter of the power supply rod 275. The inventors of the inventive concept want to set specific dimensions of components constituting the substrate support unit. The specific dimensions of the components constituting the substrate support unit are defined as follows.

Size Definition

1. D<A, A is greater than D by 10 mm or more.
2. B=A×(5 to 8), A is 5 to 8 times smaller than the diameter B of the electrode plate portion 271 of the RF support plate 270 in view of impedance efficiency and size.
3. C×(6 to 8)<E
4. E is determined in the range of 20 mm to 40 mm in consideration of the frequency and power of RF power.
5. (2×C)+E=D When the deformation portion 272 is provided in a chamfer shape, the distance x or y of the chamfer, which is a chamfer value, may be defined as follows.

$C$ (mm)<the distance $x$ or $y$ (mm) of the chamfer<$C$×20 (mm)

Here, the chamfer angle ranges between 0° and 90°. Meanwhile, when the deformation portion 272 is provided in a chamfer shape, the x value and the y value may differ from each other.

Figure 9:
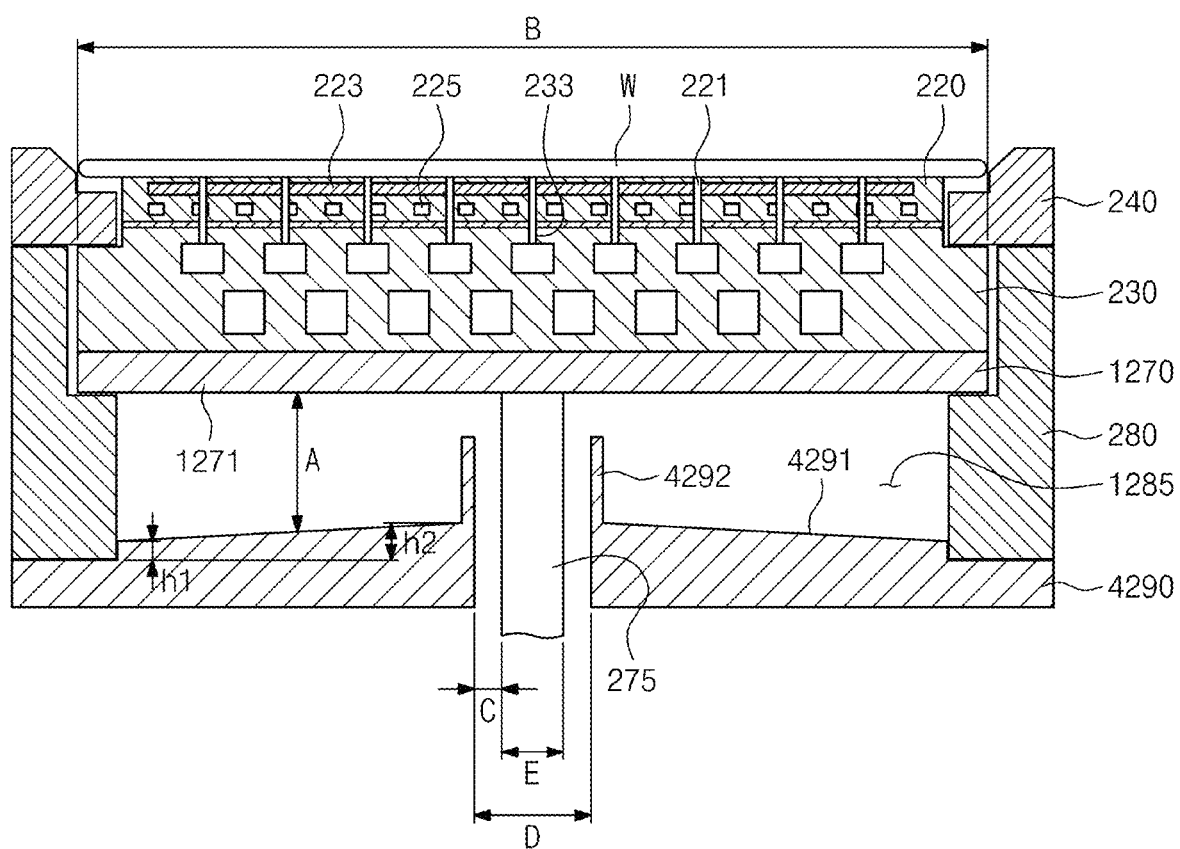
FIG. 9 is a sectional view of a substrate support unit according to a seventh embodiment.

FIG. 9 is a sectional view of a substrate support unit according to a seventh embodiment provided in the substrate treating apparatus of FIG. 2. The substrate support unit according to the seventh embodiment will be described below with reference to FIG. 9. Components identical to the components described above with reference to FIGS. 2 to 8 will be assigned with identical reference numerals, and the foregoing descriptions set forth in conjunction with FIGS. 2 to 8 may be identically applied to the components having the identical reference numerals.

Referring to FIG. 9, an RF support plate 1270 including an electrode plate portion 1271 is provided, and a power supply rod 275 is connected to the RF support plate 1270.

An air gap 1285 is formed under the RF support plate 1270. The air gap 1285 is formed between the RF support plate 1270 and a ground plate 4290 to be described below. The air gap 1285 may be surrounded by an insulating cover 280. The air gap 1285 electrically insulates the RF support plate 1270 and the ground member 4290.

The ground member 4290 is an electrically grounded component. The ground member 4290 has, in the center thereof, a through-hole through which the power supply rod 275 passes. A guide portion 4292 extends toward the air gap 1285 from the inner diameter of the through-hole formed in the center of the ground member 4290. The guide portion 4292 is formed to surround the power supply rod 275.

The upper surface of a plate portion 4291 of the ground member 4290 may be formed such that an inner area and an outer area have different heights. The inner area is an area close to the power supply rod 275 and the portion where the through-hole is formed, and the outer area is an area close to the insulating cover 280. For example, the height of the upper surface of the plate portion 4291 may be decreased from the inner area toward the outer area. That is, the height h2 of the inner area may be greater than the height h1 of the outer area.

The shape of the upper surface of the plate portion 4291 illustrated in FIG. 9 may be applied together with the embodiments illustrated in FIGS. 3 to 8.

In addition to an effect of improving RF power delivery efficiency through optimization of the impedance of the portion where high field strength is formed, an effect of improving etch rate (ER) uniformity for each region of a substrate W through electric field uniformity control of a CCP electrode and/or an effect of high SCD resistance are obtained. Furthermore, according to the embodiment of the inventive concept, when RF power is fed, an eddy current formed in the area of the ground member 4291 corresponding to the RF support plate 1270 may be minimized.

In FIG. 9, "A" means the gap between the bottom surface of the electrode plate portion 1271 of the RF support plate 1270 and the upper surface of the plate portion 4291 of the ground member 4290. "B" means the diameter of the electrode plate portion 1271. "C" means the separation gap between the inner wall of the guide portion 4292 and the power supply rod 275. "D" means the inner diameter of the guide portion 4292. "E" means the diameter of the power supply rod 275. The inventors of the inventive concept want to set specific dimensions of components constituting the substrate support unit. The specific dimensions of the components constituting the substrate support unit are defined as follows.

Size Definition

Figure 10:
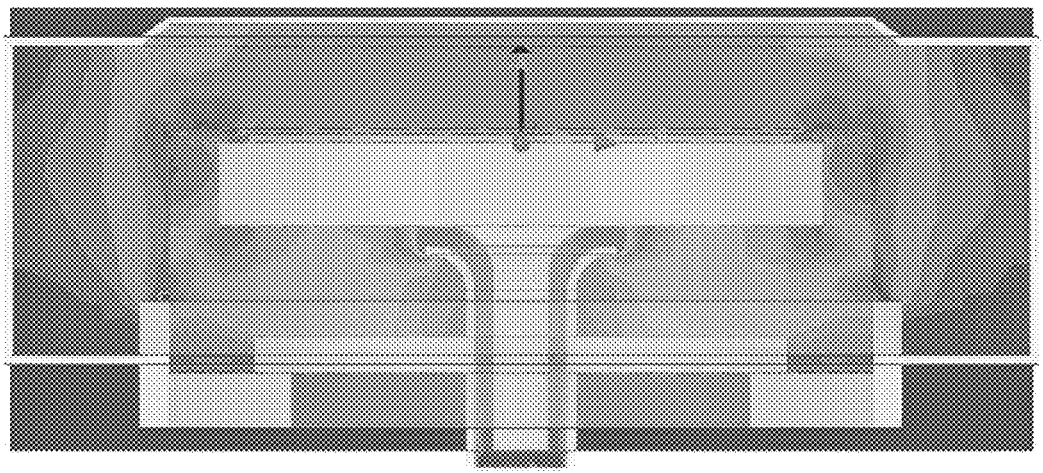
FIG. 10 illustrates a simulation result of RF energy of the substrate support unit according to the fifth embodiment of the inventive step illustrated in FIG. 7.

1. D<A, A is greater than D by 10 mm or more.
2. B=A×(5 to 8), A is 5 to 8 times smaller than the diameter B of the electrode plate portion 1271 of the RF support plate 1270 in view of impedance efficiency and size.
3. C×(6 to 8)<E
4. E is determined in the range of 20 mm to 40 mm in consideration of the frequency and power of RF power.
5. (2×C)+E=D FIG. 10 illustrates a simulation result of RF energy of the substrate support unit according to the fifth embodiment of the inventive step illustrated in FIG. 7. Referring to FIG. 10, it can be seen that the field strength concentrated on the central portion of the wafer is relatively low and accordingly acts as an important factor capable of adjusting process quality and the resonance point of the RF wavelength is more efficiently avoided.

Figure 11:
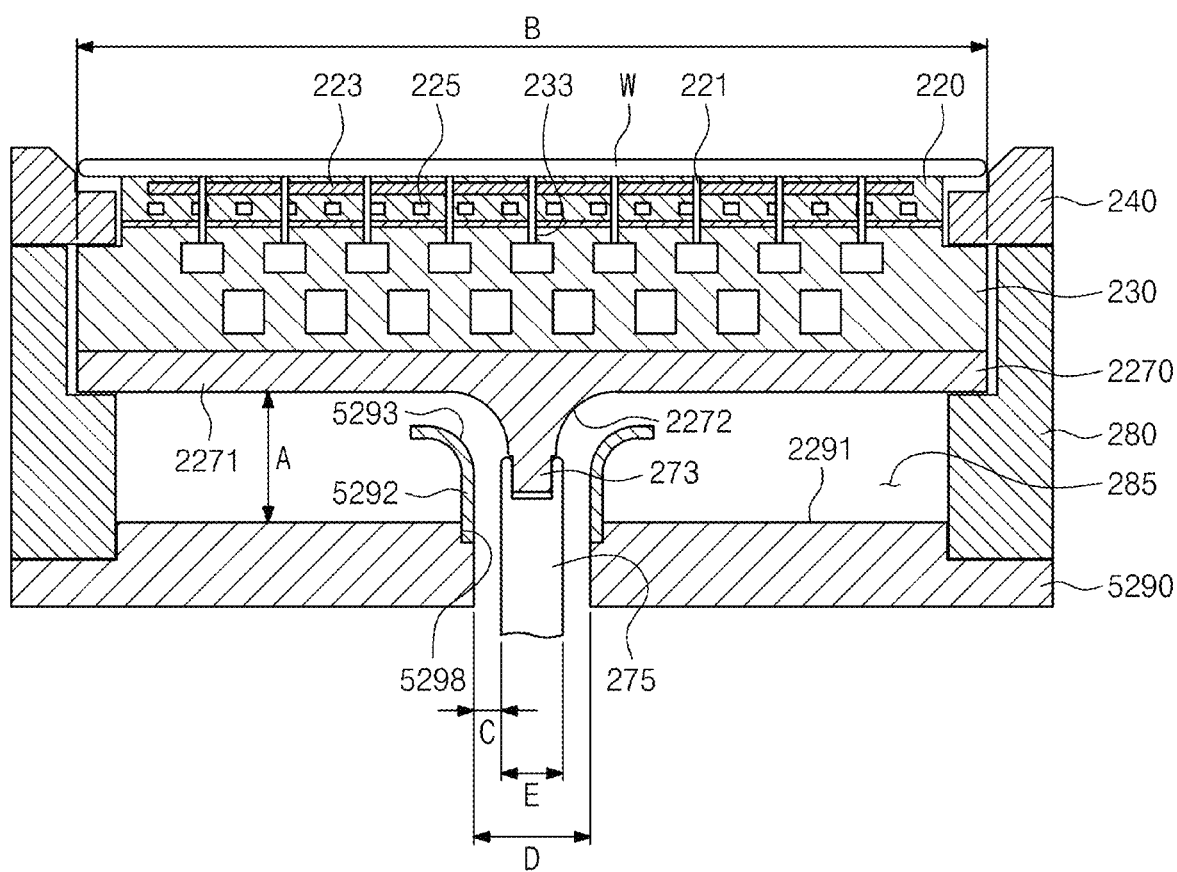
FIG. 11 is a sectional view of a substrate support unit according to an eighth embodiment.

FIG. 11 is a sectional view of a substrate support unit according to an eighth embodiment provided in the substrate treating apparatus of FIG. 2. The substrate support unit according to the eighth embodiment will be described below with reference to FIG. 11. Components identical to the components described above with reference to FIGS. 2 to 9 will be assigned with identical reference numerals, and the foregoing descriptions set forth in conjunction with FIGS. 2 to 9 may be identically applied to the components having the identical reference numerals.

Referring to FIG. 11, a guide portion 5292 is provided as a separate component from a plate portion 5291 of a ground member 5290 and is coupled with the plate portion 5291. A coupling portion 5298 may be formed in a through-hole of the plate portion 5291, and the guide portion 5292 may be coupled to the coupling portion 5298. The guide portion 5292 may be formed of a conductive material. The guide portion 5292 may be formed of a material containing metal. The guide portion 5292 may be grounded. For example, the guide portion 5292 may be electrically connected with the plate portion 5291. The plate portion 5291 is formed of a conductive material. The plate portion 5291 may be independently grounded, or may be electrically connected with the chamber 100. The chamber 100 may be grounded.

The following description will be given with reference to FIG. 2 again.

Referring again to FIG. 2, the showerhead unit 300 may disperse a gas supplied from above. Furthermore, the showerhead unit 300 may allow the gas supplied by the gas supply unit 400 to be uniformly supplied into the process space 102. The showerhead unit 300 includes a showerhead 310 and a gas injection plate 320.

The showerhead 310 is disposed under the gas injection plate 320. The showerhead 310 is spaced apart downward from the upper surface of the chamber 100 by a predetermined distance. The showerhead 310 is located over the substrate support unit 200. A predetermined space is formed between the showerhead 310 and the upper surface of the chamber 100. The showerhead 310 may be provided in a plate shape having a constant thickness. The bottom surface of the showerhead 310 may be anodized to prevent an electric arc caused by plasma. The section of the showerhead 310 may have the same shape and cross-sectional area as that of the substrate support unit 200. The showerhead 310 has a plurality of gas supply holes 312 formed therein. The gas supply holes 312 may be vertically formed through the upper and lower surfaces of the showerhead 310.

The showerhead 310 may be formed of a material that generates a compound by reacting with plasma generated from the gas supplied by the gas supply unit 400. For example, the showerhead 310 may be formed of a material that generates a compound by reacting with ions having the highest electro-negativity among the ions included in the plasma. For example, the showerhead 310 may be formed of a material containing silicon (Si).

The gas injection plate 320 is disposed over the showerhead 310. The gas injection plate 320 is spaced apart from the upper surface of the chamber 100 by a predetermined distance. The gas injection plate 320 may diffuse the gas supplied from above. The gas injection plate 320 may have gas introduction holes 322 formed therein. The gas introduction holes 322 may be formed in positions corresponding to the gas supply holes 312 described above. The gas introduction holes 322 may be fluidly connected with the gas supply holes 312. The gas supplied from above the showerhead unit 300 may sequentially pass through the gas introduction holes 322 and the gas supply holes 312 and may be supplied below the showerhead 310. The gas injection plate 320 may contain a metallic material. The gas injection plate 320 may be grounded. The gas injection plate 320 may be grounded and may function as an upper electrode.

An insulating ring 380 is disposed around the showerhead 310 and the gas injection plate 320. The insulating ring 380 may have a circular ring shape as a whole. The insulating ring 380 may be formed of a non-metallic material.

The gas supply unit 400 supplies a process gas into the chamber 100. The gas supply unit 400 includes a gas supply nozzle 410, a gas supply line 420, and a gas reservoir 430. The gas supply nozzle 410 may be provided in the center of the top of the chamber 100. The gas supply nozzle 410 has an injection hole formed in the bottom thereof. The process gas supplied through the gas supply nozzle 410 is supplied into the process space of the chamber 100 through the showerhead unit 300. The gas supply line 420 connects the gas supply nozzle 410 and the gas reservoir 430. The gas supply line 420 supplies the process gas stored in the gas reservoir 430 to the gas supply nozzle 410. A valve 420 is disposed in-line with the gas supply line 421. The valve 421 opens and closes the gas supply line 420 and regulates the flow rate of the process gas that is supplied through the gas supply line 420.

The gas supplied by the gas supply unit 400 may be excited into a plasma state by the plasma source. The gas supplied by the gas supply unit 400 may be a gas containing fluorine. For example, the gas supplied by the gas supply unit 400 may be carbon tetrafluoride.

The plasma source excites the process gas in the chamber 100 into plasma. In an embodiment of the inventive concept, a capacitively coupled plasma (CCP) source is used as the plasma source. The capacitively coupled plasma source may include an upper electrode and a lower electrode in the chamber 100. The upper electrode and the lower electrode may be disposed in the vertical direction in the chamber 100 so as to be parallel to each other. One of the opposite electrodes may apply RF power, and the other may be grounded. An electromagnetic field may be formed in the space between the opposite electrodes, and the process gas supplied into the space may be excited into plasma. A process of treating the substrate W is performed by using the plasma. According to an embodiment, the upper electrode may be implemented with the showerhead unit 300, and the lower electrode may be implemented by a combination of the body plate 230 and the RF support plate 240. RF power may be applied to the lower electrode, and the upper electrode may be grounded. Alternatively, RF power may be applied to both the upper electrode and the lower electrode. Due to this, an electromagnetic field is generated between the upper electrode and the lower electrode. The generated electromagnetic field excites the process gas in the chamber 100 into plasma.

The liner unit (not illustrated) prevents the inner wall of the chamber 100 and the substrate support unit 200 from being damaged during a process. The liner unit (not illustrated) prevents impurities generated during the process from being deposited on the inner wall of the chamber 100 and the substrate support unit 200. The liner unit (not illustrated) includes an inner liner (not illustrated) and an outer liner (not illustrated).

The outer liner (not illustrated) is provided on the inner wall of the chamber 100. The outer liner (not illustrated) has a space that is open at the top and the bottom. The outer liner (not illustrated) may have a hollow cylindrical shape. The outer liner (not illustrated) may have a radius corresponding to the inside surface of the chamber 100. The outer liner (not illustrated) is provided along the inside surface of the chamber 100. The outer liner (not illustrated) may be formed of an aluminum material. The outer liner (not illustrated) protects the inside surface of the chamber 100. Arc discharge may occur inside the chamber 100 in the process in which the process gas is excited. The arc discharge causes damage to the chamber 100. The outer liner (not illustrated) protects the inside surface of the chamber 100, thereby preventing the inside surface of the chamber 100 from being damaged by the arc discharge.

The inner liner (not illustrated) surrounds the substrate support unit 200. The inner liner (not illustrated) has a ring shape. The inner liner (not illustrated) surrounds the insulating cover 280. The inner liner (not illustrated) may be formed of an aluminum material. The inner liner (not illustrated) protects the outside surface of the substrate support unit 200.

The baffle unit 500 is located between the inner wall of the chamber 100 and the substrate support unit 200. The baffle unit 500 has an annular ring shape. The baffle unit 500 has a plurality of through-holes formed therein. The gas supplied into the chamber 100 passes through the through-holes of the baffle unit 500 and is released through the exhaust hole 104. A flow of the gas may be controlled depending on the shape of the baffle unit 500 and the shape of the through-holes.

The controller (not illustrated) may control overall operation of the substrate treating apparatus 1000. The controller (not illustrated) may include a central processing unit (CPU), a read only memory (ROM), and a random access memory (RAM). The CPU executes desired processing, such as etching, depending on various types of recipes stored in storage areas of the memories.

Control information of the apparatus for process conditions, such as process time, process pressure, RF power or voltage, flow rates of various gases, temperature in a chamber (electrode temperature, chamber sidewall temperature, and electrostatic chuck temperature), cooler temperature, and the like, are input in the recipes. Meanwhile, the recipes representing the programs or process conditions may be stored in a non-transitory computer readable medium. The non-transitory computer readable medium refers to a medium that semi-permanently stores data and is readable by a computer, rather than a medium (e.g., a resister, a cache, or a memory) that stores data for a short period of time. Specifically, the above-described various applications or programs may be stored in a non-transitory computer readable medium such as a CD, a DVD, a hard disc, a blue-ray disc, a USB, a memory card, and a ROM.

Although it has been described that the power supply rod is coupled with the RF support plate provided under the body plate, the body plate and the RF support plate may be a single component formed of a conductive material rather than separate components. For example, the RF support plate may be formed by deforming the lower portion of the body plate where the passage through which the cooling fluid circulates is formed. That is, in the configuration functioning as the lower electrode in the substrate support unit, the technical configuration of the inventive concept may be applied to a portion to which the power supply rod for supplying RF power is coupled.

According to the various embodiments of the inventive concept, the substrate support units and the substrate treating apparatus may efficiently treat a substrate.

According to the various embodiments of the inventive concept, the substrate support units and the substrate treating apparatus may minimize concentration of an electric field on the area where the electrode and the power supply rod are connected and may minimize electrical impedance.

According to the various embodiments of the inventive concept, the substrate support units and the substrate treating apparatus may provide an additional control factor in adjusting the density of plasma generated above a substrate.

According to the various embodiments of the inventive concept, the substrate support units and the substrate treating apparatus may improve RF power delivery efficiency through optimization of the impedance of a portion where high field strength is formed and may improve etch rate (ER) uniformity for each region of a substrate through electric field uniformity control of a CCP electrode.

According to the various embodiments of the inventive concept, the substrate support units and the substrate treating apparatus may minimize an eddy current formed in an area of the ground member when feeding RF power.

According to the various embodiments of the inventive concept, the substrate support units and the substrate treating apparatus may minimize noise caused by RF energy delivered to the ground member in a process of feeding RF power.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate support unit provided in an apparatus for treating a substrate using plasma, the substrate support unit comprising:
    a dielectric plate on which the substrate is placed;
    a lower electrode disposed under the dielectric plate, the lower electrode having a first diameter;
    a power supply rod configured to apply RF power to the lower electrode, the power supply rod having a second diameter; and
    a ground member disposed under the lower electrode and spaced apart from the lower electrode by a first gap by an insulating member, the ground member including a plate portion parallel to the lower electrode, and the plate portion having a through-hole formed therein through which the power supply rod passes, wherein the through-hole has a third diameter,
    wherein the lower electrode includes a deformation portion extending downward from a center of a lower surface of the lower electrode, and having a decreasing diameter toward the bottom, and the power supply rod is coupled to an end portion of the deformation portion,
    wherein the ground member has a guide portion extending upwardly in the first gap from an inner diameter of the through-hole by a predetermined length.

2. The substrate support unit of claim 1, wherein the guide portion is spaced apart from the power supply rod by a second gap.

3. The substrate support unit of claim 2, wherein the guide portion includes an extension extending along the deformation portion and spaced apart from the deformation portion by a predetermined distance.

4. The substrate support unit of claim 2, wherein the guide portion is integrally formed with the ground member, or formed separately from the ground member, and is electrically connected with the ground member.

5. The substrate support unit of claim 1, wherein the deformation portion is formed in a tapered shape having a decreasing diameter toward the bottom.

6. The substrate support unit of claim 1, wherein the deformation portion is formed in a rounded shape, a vertical cross-section of which has a decreasing diameter toward the bottom.

7. The substrate support unit of claim 1, wherein the first diameter is five to eight times greater than the first gap.

8. The substrate support unit of claim 1, wherein the first gap is greater than the third diameter by 10 mm or more.

9. The substrate support unit of claim 2, wherein the second diameter is six to eight times greater than the second gap.

* * * * *